United States Patent
Balakrishnan et al.

(10) Patent No.: US 9,472,671 B1
(45) Date of Patent: Oct. 18, 2016

(54) METHOD AND STRUCTURE FOR FORMING DUALLY STRAINED SILICON

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/929,312

(22) Filed: Oct. 31, 2015

(51) Int. Cl.
*H01L 29/78* (2006.01)
*H01L 27/092* (2006.01)
*H01L 27/12* (2006.01)
*H01L 29/161* (2006.01)
*H01L 29/165* (2006.01)
*H01L 21/02* (2006.01)
*H01L 21/324* (2006.01)
*H01L 21/8238* (2006.01)
*H01L 21/84* (2006.01)

(52) U.S. Cl.
CPC ..... *H01L 29/7849* (2013.01); *H01L 21/02532* (2013.01); *H01L 21/324* (2013.01); *H01L 21/823807* (2013.01); *H01L 21/84* (2013.01); *H01L 27/0922* (2013.01); *H01L 27/1203* (2013.01); *H01L 29/161* (2013.01); *H01L 29/165* (2013.01)

(58) Field of Classification Search
None
See application file for complete search history.

(56) References Cited

U.S. PATENT DOCUMENTS

| | | | | |
|---|---|---|---|---|
| 5,399,507 A * | 3/1995 | Sun | | H01L 21/84 148/DIG. 13 |
| 6,306,690 B1 | 10/2001 | Kaya et al. | | 438/136 |
| 6,746,902 B2 | 6/2004 | Maa et al. | | 438/149 |
| 6,872,641 B1 | 3/2005 | Chidambarrao et al. | | 438/518 |
| 7,022,593 B2 | 4/2006 | Arena et al. | | 438/494 |
| 7,169,226 B2 | 1/2007 | Bedell et al. | | 117/43 |
| 7,205,202 B2 * | 4/2007 | Orlowski | | H01L 21/84 257/E21.703 |
| 7,247,534 B2 * | 7/2007 | Chidambarrao | | H01L 21/8213 257/18 |
| 7,524,740 B1 * | 4/2009 | Liu | | H01L 21/02532 438/479 |
| 7,608,489 B2 * | 10/2009 | Chidambarrao | | H01L 21/823807 257/213 |
| 7,619,239 B2 | 11/2009 | Irisawa et al. | | 257/19 |
| 8,084,309 B2 * | 12/2011 | Cheng | | H01L 21/84 257/351 |
| 8,803,297 B2 | 8/2014 | Nelle et al. | | 257/642 |
| 2003/0077882 A1 | 4/2003 | Shih et al. | | 438/478 |
| 2005/0156268 A1 * | 7/2005 | Chu | | H01L 21/02381 257/478 |
| 2005/0191797 A1 * | 9/2005 | Usuda | | H01L 21/76275 438/152 |
| 2007/0099369 A1 * | 5/2007 | Ning | | H01L 21/823807 438/199 |
| 2007/0166897 A1 * | 7/2007 | Chidambarrao | | H01L 21/823807 438/153 |
| 2008/0169508 A1 * | 7/2008 | Chidambarrao | | H01L 21/84 257/351 |
| 2008/0237709 A1 * | 10/2008 | Chidambarrao | | H01L 21/84 257/347 |
| 2009/0146146 A1 * | 6/2009 | Knoefler | | H01L 21/26506 257/51 |
| 2010/0013024 A1 * | 1/2010 | Chidambarrao | | H01L 21/823807 257/369 |
| 2011/0070701 A1 * | 3/2011 | Ning | | H01L 21/823807 438/199 |
| 2014/0231811 A1 | 8/2014 | Yan et al. | | 257/66 |
| 2016/0104799 A1 * | 4/2016 | Qi | | H01L 29/7849 257/29 |

* cited by examiner

*Primary Examiner* — Scott B Geyer
(74) *Attorney, Agent, or Firm* — Ido Tuchman; Louis J. Percello

(57) ABSTRACT

A semiconductor structure and method for fabricating such. The semiconductor structure includes a monolithic substrate, a first dielectric layer carried by the monolithic substrate and a second dielectric layer carried by the monolithic substrate. The first dielectric layer has a first Young's modulus, and the second dielectric layer has a second Young's modulus. The first Young's modulus is at least twice the second Young's modulus. A compressive SiGe layer is positioned over and in contact with the first dielectric layer. A relaxed SiGe layer is positioned over and in contact with the second dielectric layer. The relaxed SiGe layer is spaced apart from the compressive SiGe layer.

20 Claims, 6 Drawing Sheets

METHOD AND STRUCTURE FOR FORMING DUALLY STRAINED SILICON

BACKGROUND

The present invention is directed toward semiconductor structures, and more particularly to forming a dually strained silicon structure with different dielectric materials underneath the silicon.

Strain engineering is critical for improving complementary metal-oxide semiconductor (CMOS) performance. With continued downscaling of devices, the conventional external stress techniques (e.g., stress liners) run out of steam due to the diminishing spacing for incorporating those external stressors. Thus, as technology advances, channel strain becomes increasingly important.

Young's modulus, also known as the elastic modulus, defines the relationship between stress (force per unit area) and strain (proportional deformation) in a material. Specifically, Young's modulus is the ratio of the stress (force per unit area) along an axis to the strain (ratio of deformation over initial length) along that axis in the range of stress in which Hooke's law holds.

BRIEF SUMMARY

Aspects of the present invention include methods and structures for forming dually strained CMOS (tensile Si NFET and compressive SiGe PFET) by bonding initially compressive strain SiGe on pre-patterned dielectric materials on base wafer. The SiGe is bonded on a "soft" dielectric in an NFET region so it elastically relaxes. In a PFET region, the SiGe is bonded to a rigid dielectric so it remains compressively strained. Tensile Si is then epitaxially grown on the relaxed SiGe. The process results in a unique structure of tensile Si on relaxed SiGe on soft dielectric for NFET and compressive SiGe on rigid dielectric for PFET.

One example aspect of the present invention is a semiconductor structure. The semiconductor structure includes a monolithic substrate, a first dielectric layer carried by the monolithic substrate and a second dielectric layer carried by the monolithic substrate. The first dielectric layer has a first Young's modulus, and the second dielectric layer has a second Young's modulus. The first Young's modulus is at least twice the second Young's modulus. A compressive SiGe layer is positioned over and in contact with the first dielectric layer. A relaxed SiGe layer is positioned over and in contact with the second dielectric layer. The relaxed SiGe layer is spaced apart from the compressive SiGe layer.

Another example aspect of the present invention is a method for fabricating a semiconductor structure. The method includes depositing a first dielectric layer with a first Young's modulus over a substrate. Another depositing step deposits a second dielectric layer with a second Young's modulus over the monolithic substrate lateral to the first dielectric layer. The first Young's modulus is at least twice the second Young's modulus. A bonding step bonds a compressed SiGe layer to the first dielectric layer and the second dielectric layer. An annealing step anneals the semiconductor structure such that a first region of the SiGe layer over the first dielectric layer remains the compressed SiGe layer and a second region of the SiGe layer over the second dielectric layer forms a relaxed SiGe layer.

A further example aspect of the present invention is a method for fabricating a semiconductor structure. The method is depositing a first dielectric layer with a first Young's modulus over a substrate. Another depositing step deposits a second dielectric layer with a second Young's modulus over the monolithic substrate lateral to the first dielectric layer. The second Young's modulus is a least twice the first Young's modulus. A bonding step bonds a compressed SiGe layer to the first dielectric layer and the second dielectric layer. An annealing step anneals the semiconductor structure such that a first region of the SiGe layer over the first dielectric layer forms a relaxed SiGe layer.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
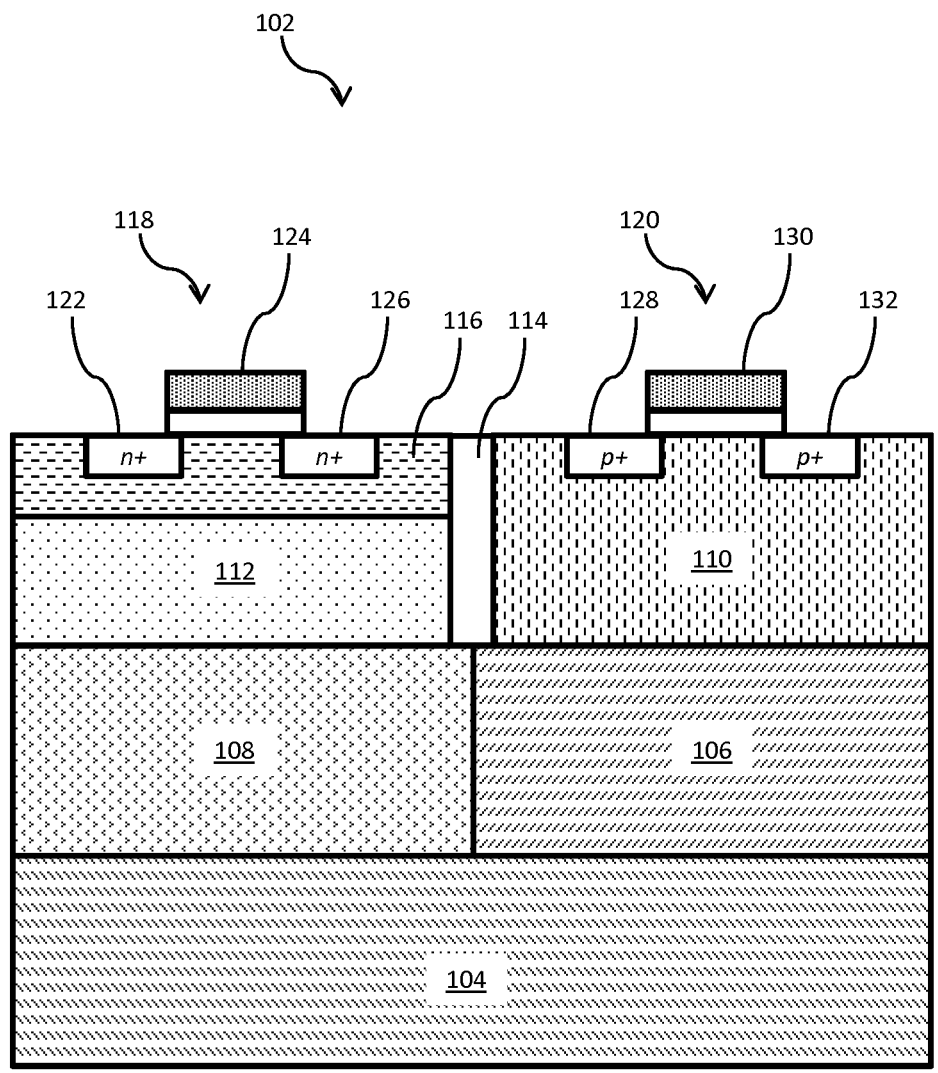
FIG. 1 shows an example semiconductor structure contemplated by the present invention.

The present invention is described with reference to embodiments of the invention. Throughout the description of the invention reference is made to FIGS. 1-10. When referring to the figures, like structures and elements shown throughout are indicated with like reference numerals.

FIG. 1 shows an example semiconductor structure 102 contemplated by the present invention. The semiconductor structure 102 includes a monolithic substrate 104, such as crystalline Si.

A first dielectric layer 106 with a first Young's modulus is carried by the substrate 104. A second dielectric layer 108 with a second Young's modulus is carried by the monolithic substrate 104 and is positioned lateral to the first dielectric layer 106. Furthermore, the first Young's modulus is at least twice the second Young's modulus. In one embodiment, the first Young's modulus is greater than 200 GPa and the second Young's modulus is less than 100 GPa. The first dielectric layer 106 may be composed of a different material than the second dielectric layer 108. For example, the first dielectric layer 106 may be a nitride material, such as silicon nitride ($Si_3N_4$), and the second dielectric layer 108 may be an oxide material, such as borophosphosilicate glass (BPSG).

A compressive SiGe layer 110 is positioned over and in contact with the first dielectric layer 106. Compressive straining of SiGe can improve hole mobility within the SiGe. A relaxed SiGe layer 112 is positioned over and in contact with the second dielectric layer 108.

The relaxed SiGe layer 112 is spaced apart from the compressive SiGe layer 110 by a dielectric divider 114 positioned between the relaxed SiGe layer 112 and the compressive SiGe layer 110. It is contemplated that first dielectric layer 106 and the second dielectric layer 108 may also be spaced apart by the dielectric divider 114. In one embodiment, the dielectric divider 114 is $SiO_2$.

The semiconductor structure 102 includes a tensile Si layer 116 positioned over and in contact with the relaxed SiGe layer 112. Tensile straining of Si can improve electron mobility. The tensile Si layer 116 is also spaced apart from the compressive SiGe layer 110 by the dielectric divider 114.

The semiconductor structure 102 may include a lateral, n-channel field-effect transistor (NFET) 118 at the tensile Si layer 116, and a lateral, p-channel field-effect transistor (PFET) 120 at the compressive SiGe layer 110. Specifically, the NFET 118 includes an n-doped source 122, gate 124 and n-doped drain 126. Similarly, the PFET includes a p-doped source 128, gate 130 and p-doped drain 132. It is contemplated that in other embodiments of the present invention the Si layer 116 and/or SiGe layer 110 can be used to form multigate devices, such as FinFETs.

Since the NFET 118 is fabricated on tensile Si, its performance is enhanced by greater electron mobility at its channel. Since the PFET 120 is fabricated on compressive SiGe, its performance is enhanced by greater hole mobility at its channel. Thus, the semiconductor structure 102 can include dually strained CMOS (tensile Si NFET and compressive SiGe PFET).

Figure 2:
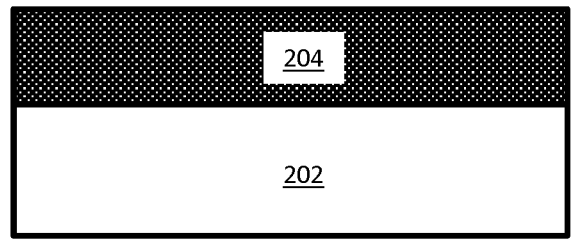
FIG. 2 shows a fabrication step of depositing a first dielectric layer with a first Young's modulus over a substrate.

Another embodiment of the present invention is a method for fabricating a semiconductor structure, as illustrated in FIGS. 2-10. FIG. 2 shows a fabrication step of depositing a first dielectric layer 204 with a first Young's modulus over a substrate 202. In one embodiment, the first Young's modulus is greater than 200 GPa. The first dielectric layer 204 may be a nitride material, such as silicon nitride ($Si_3N_4$).

Figure 3:
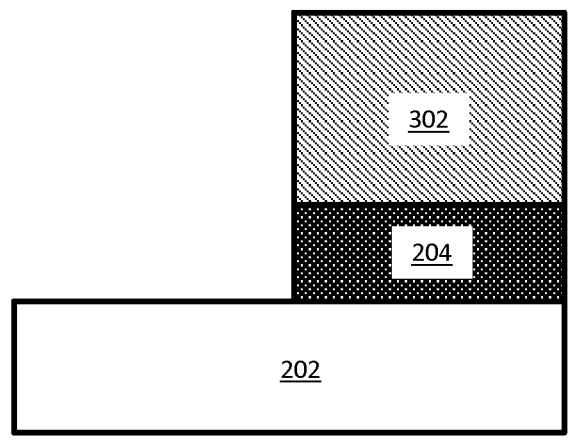
FIG. 3 shows a fabrication step of patterning the first dielectric layer using a hardmask.

FIG. 3 shows a fabrication step of patterning the first dielectric layer 204 using a hardmask 302. This step may be achieved using, for example, reactive ion etching (RIE).

Figure 4:
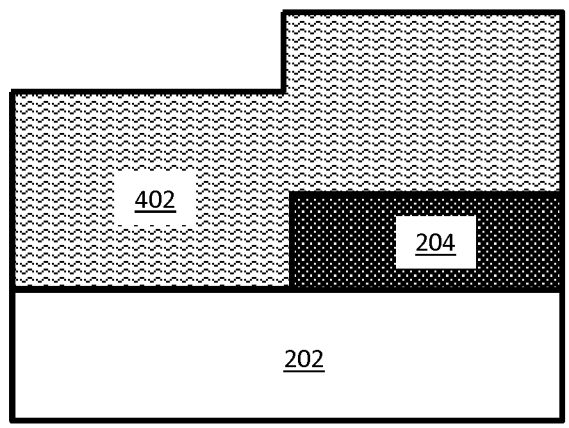
FIG. 4 shows the fabrication steps of removing the hardmask and depositing a second dielectric layer with a second Young's modulus over the monolithic substrate lateral to the first dielectric layer.

FIG. 4 shows the fabrication steps of removing the hardmask 302 and depositing a second dielectric layer 402 with a second Young's modulus over the monolithic substrate 202 lateral to the first dielectric layer. In one embodiment, the first Young's modulus is at least twice the second Young's modulus. In a particular embodiment, the second Young's modulus is less than 100 GPa. The second dielectric layer 402 may be composed of a different material than the first dielectric layer 204. In one embodiment, the second dielectric layer 402 is an oxide material, such as borophosphosilicate glass (BPSG).

Figure 5:
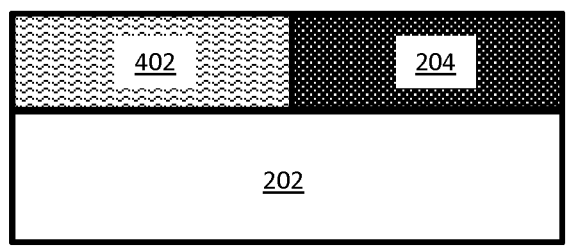
FIG. 5 shows a fabrication step of planarizing the first dielectric layer and the second dielectric layer.

FIG. 5 shows a fabrication step of planarizing the first dielectric layer 204 and the second dielectric layer 402. This step may be achieved using, for example, chemical mechanical planarization (CMP). Those skilled in the art will appreciate that the order in which the dielectric layers 204 and 402 are deposited may be reversed. For example, the fabrication process may include depositing a soft oxide layer (e.g., Young's modulus less than 100 GPa) then depositing a rigid nitride layer (e.g., Young's modulus greater than 200 GPa).

Figure 6:
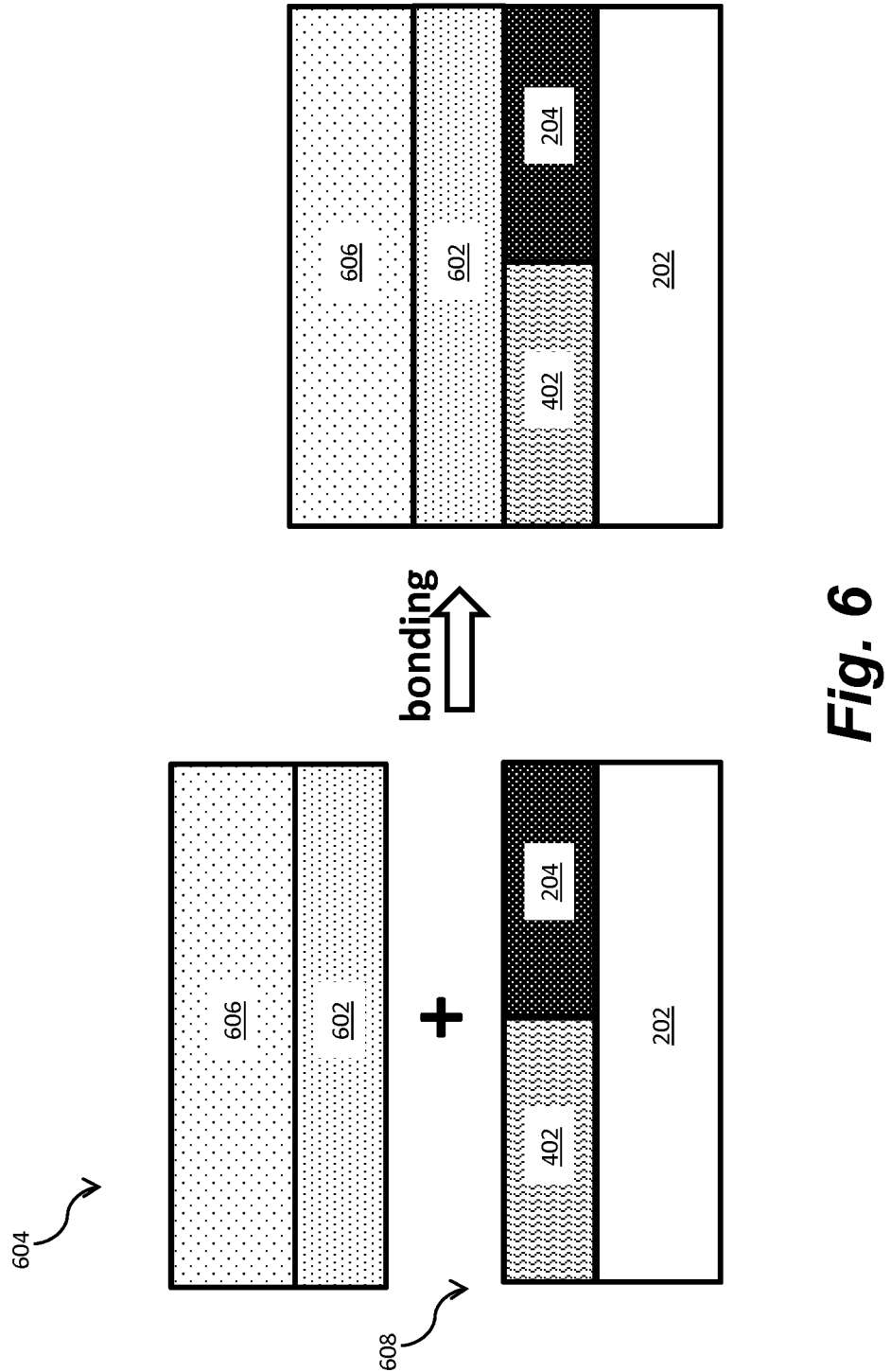
FIG. 6 shows a fabrication step of bonding a compressed SiGe layer to the first dielectric layer and the second dielectric layer.

FIG. 6 shows a fabrication step of bonding a compressed SiGe layer 602 to the first dielectric layer 204 and the second dielectric layer 402. During this operation, a donor wafer 604 is prepared by epitaxially growing SiGe on the donor Si substrate 606. The donor wafer 604 is then directly bonded to the base wafer 608.

Figure 7:
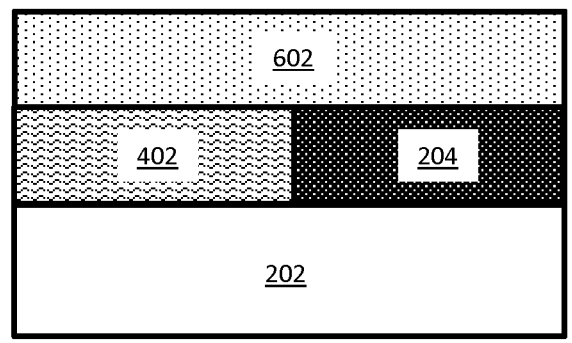
FIG. 7 shows a fabrication step of removing the donor Si substrate from the bonded wafer.

FIG. 7 shows a fabrication step of removing the donor Si substrate 606 from the bonded wafer. This step can include CMP followed by a chemical etch to accurately adjust the thickness of the remaining compressed SiGe layer 602.

Figure 8:
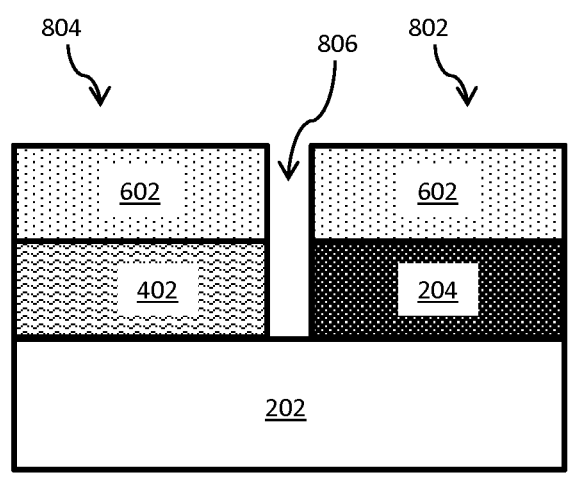
FIG. 8 shows a fabrication step of etching the SiGe layer so that a first region of the SiGe layer over the first dielectric layer is spaced apart from the second region of the SiGe layer over the second dielectric layer by a separation region.

FIG. 8 shows a fabrication step of etching the SiGe layer 602 so that a first region 802 of the SiGe layer 602 over the first dielectric layer 602 is spaced apart from the second region 804 of the SiGe layer 602 over the second dielectric layer 402 by a separation region 806. The separation region 806 may be etched through the first dielectric layer 204 and the second dielectric layer 402 and stopping at the substrate 202. Alternatively, as shown in FIG. 1, the separation region 806 may stop at the first dielectric layer 204 and the second dielectric layer 402.

Figure 9:
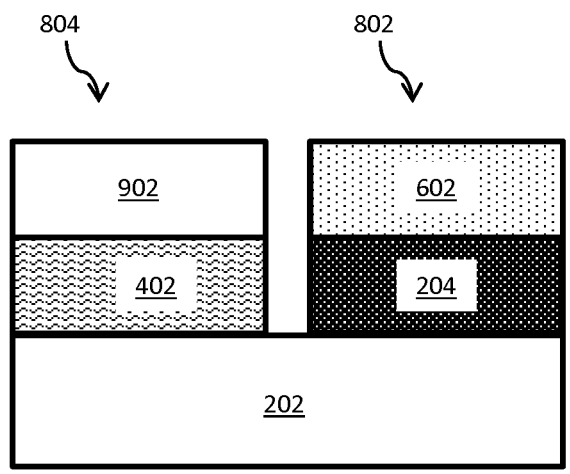
FIG. 9 shows a fabrication step of annealing the semiconductor structure such that the first region of the SiGe layer over the first dielectric layer remains the compressed SiGe layer and the second region of the SiGe layer over the second dielectric layer forms a relaxed SiGe layer.

FIG. 9 shows a fabrication step of annealing the semiconductor structure such that the first region 802 of the SiGe layer over the first dielectric layer 204 remains the compressed SiGe layer 602 and the second region 804 of the SiGe layer over the second dielectric layer 402 forms a relaxed SiGe layer 902.

Figure 10:
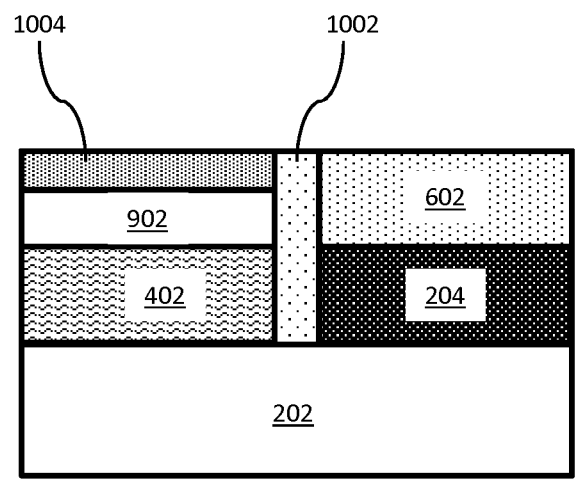
FIG. 10 shows a fabrication step of depositing a dielectric material in the separation region.

FIG. 10 shows a fabrication step of depositing a dielectric material 1002 in the separation region. In one embodiment, the dielectric material 1002 is $SiO_2$. The figure also shows a fabrication step of growing an epitaxial Si layer over the relaxed SiGe layer 902 to form a tensile Si layer 1004 in contact with the relaxed SiGe 902. This step may include etching the relaxed SiGe 902 before growing the epitaxial Si layer.

Returning to FIG. 1, the fabrication process may include forming an n-channel field-effect transistor (NFET) at the tensile Si layer, and forming a p-channel field-effect transistor (PFET) at the compressive SiGe layer. Thus, a dually strained CMOS structure (tensile Si NFET and compressive SiGe PFET) is formed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
   a monolithic substrate;
   a first dielectric layer with a first Young's modulus carried by the monolithic substrate;
   a second dielectric layer with a second Young's modulus carried by the monolithic substrate, the second dielectric layer positioned lateral to the first dielectric layer, the first Young's modulus is at least twice the second Young's modulus;
   a compressive SiGe layer positioned over and in contact with the first dielectric layer; and a relaxed SiGe layer positioned over and in contact with the second dielectric layer, the relaxed SiGe layer spaced apart from the compressive SiGe layer.

2. The semiconductor structure of claim 1, further comprising a tensile Si layer positioned over and in contact with the relaxed SiGe layer, the tensile Si layer spaced apart from the compressive SiGe layer.

3. The semiconductor structure of claim 2, further comprising:
    an n-channel field-effect transistor (NFET) at the tensile Si layer; and
    a p-channel field-effect transistor (PFET) at the compressive SiGe layer.

4. The semiconductor structure of claim 1, wherein the first dielectric layer is composed of a different material than the second dielectric layer.

5. The semiconductor structure of claim 1, wherein the first dielectric layer is a nitride material and the second dielectric layer is an oxide material.

6. The semiconductor structure of claim 5, wherein the first dielectric layer is silicon nitride ($Si_3N_4$) and the second dielectric layer is borophosphosilicate glass (BPSG).

7. The semiconductor structure of claim 1, wherein the first Young's modulus is greater than 200 GPa and the second Young's modulus is less than 100 GPa.

8. The semiconductor structure of claim 1, further comprising a dielectric divider positioned between the relaxed SiGe layer and the compressive SiGe layer.

9. A method for fabricating a semiconductor structure, the method comprising:
    depositing a first dielectric layer with a first Young's modulus over a substrate;
    depositing a second dielectric layer with a second Young's modulus over the monolithic substrate lateral to the first dielectric layer, the first Young's modulus is at least twice the second Young's modulus;
    bonding a compressed SiGe layer to the first dielectric layer and the second dielectric layer; and
    annealing the semiconductor structure such that a first region of the SiGe layer over the first dielectric layer remains the compressed SiGe layer and a second region of the SiGe layer over the second dielectric layer forms a relaxed SiGe layer.

10. The method of claim 9, further comprising growing an epitaxial Si layer over the relaxed SiGe layer to form a tensile Si layer in contact with the relaxed SiGe layer.

11. The method of claim 10, further comprising:
    forming an n-channel field-effect transistor (NFET) at the tensile Si layer; and
    forming a p-channel field-effect transistor (PFET) at the compressive SiGe layer.

12. The method of claim 9, further comprising etching the SiGe layer before annealing the semiconductor structure such that the first region of the SiGe layer over the first dielectric layer is spaced apart from the second region of the SiGe layer over the second dielectric layer by a separation region.

13. The method of claim 12, further comprising depositing a dielectric material in the separation region.

14. The method of claim 9, wherein the first dielectric layer is composed of a different material than the second dielectric layer.

15. The method of claim 9, wherein the first dielectric layer is a nitride material and the second dielectric layer is an oxide material.

16. The method of claim 9, wherein the first dielectric layer is silicon nitride ($Si_3N_4$) and the second dielectric layer is borophosphosilicate glass (BPSG).

17. The method of claim 9, wherein the first Young's modulus is greater than 200 GPa and the second Young's modulus is less than 100 GPa.

18. A method for fabricating a semiconductor structure, the method comprising:
    depositing a first dielectric layer with a first Young's modulus over a substrate;
    depositing a second dielectric layer with a second Young's modulus over the monolithic substrate lateral to the first dielectric layer, the second Young's modulus is a least twice the first Young's modulus;
    bonding a compressed SiGe layer to the first dielectric layer and the second dielectric layer; and
    annealing the semiconductor structure such that a first region of the SiGe layer over the first dielectric layer forms a relaxed SiGe layer.

19. The method of claim 18, further comprising etching the SiGe layer before annealing the semiconductor structure such that the first region of the SiGe layer over the first dielectric layer is spaced apart from a second region of the SiGe layer over the second dielectric layer by a separation region.

20. The method of claim 18, further comprising growing an epitaxial Si layer over the relaxed SiGe layer to form a tensile Si layer in contact with the relaxed SiGe layer.

* * * * *